US011606095B2

(12) United States Patent
Zhao et al.

(10) Patent No.: US 11,606,095 B2
(45) Date of Patent: Mar. 14, 2023

(54) OPERATING CLOCK GENERATOR AND REFERENCE CLOCK GATING CIRCUIT

(71) Applicant: REALTEK SEMICONDUCTOR CORPORATION, Hsinchu (TW)

(72) Inventors: Shi-Yao Zhao, Suzhou (CN); Dao-Fu Wang, Suzhou (CN); Yong-Peng Jing, Suzhou (CN)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 73 days.

(21) Appl. No.: 17/380,069

(22) Filed: Jul. 20, 2021

(65) Prior Publication Data

US 2022/0158642 A1 May 19, 2022

(30) Foreign Application Priority Data

Nov. 13, 2020 (CN) .......................... 202011274721.3

(51) Int. Cl.
*G06F 1/10* (2006.01)
*H03L 7/08* (2006.01)
*H03K 19/00* (2006.01)
*G06F 1/14* (2006.01)
*G06F 1/12* (2006.01)

(52) U.S. Cl.
CPC .............. *H03L 7/0802* (2013.01); *G06F 1/12* (2013.01); *G06F 1/14* (2013.01); *H03K 19/0016* (2013.01)

(58) Field of Classification Search
CPC ...................................... G06F 1/10; G06F 1/08
See application file for complete search history.

(56) References Cited

U.S. PATENT DOCUMENTS

| 6,750,693 | B1* | 6/2004 | Duewer | G06F 1/08 |
| | | | | 327/298 |
| 7,233,186 | B2* | 6/2007 | Ishimi | G06F 1/08 |
| | | | | 327/295 |
| 9,360,883 | B1* | 6/2016 | Barman | G06F 1/08 |
| 2003/0002606 | A1* | 1/2003 | Chen | H04L 7/0045 |
| | | | | 375/354 |
| 2008/0225989 | A1* | 9/2008 | An | H03L 7/193 |
| | | | | 375/326 |
| 2011/0298502 | A1* | 12/2011 | Chen | G06F 1/324 |
| | | | | 327/225 |
| 2012/0049911 | A1* | 3/2012 | Ura | H03L 7/18 |
| | | | | 327/156 |

* cited by examiner

*Primary Examiner* — Phil K Nguyen
(74) *Attorney, Agent, or Firm* — WPAT, PC

(57) ABSTRACT

Disclosed is a reference clock gating circuit for outputting a reliable reference clock according to an external clock. The circuit includes a detection circuit and a gating component. The detection circuit includes: a first counter counting according to triggers of the external clock and thereby generating a first clock number; a second counter counting according to triggers of an accurate slow clock and thereby generating a second clock number; and a decision circuit determining whether a ratio of the first clock number to the second clock number satisfies a predetermined condition after the second clock number reaches a predetermined number, and thereby generating a gating signal to control the gating component. If the ratio satisfies the predetermined condition, the gating component receives the external clock and outputs it as the reference clock; and if the ratio doesn't satisfy the predetermined condition, the gating component doesn't output the external clock.

20 Claims, 6 Drawing Sheets

200

OPERATING CLOCK GENERATOR AND REFERENCE CLOCK GATING CIRCUIT

BACKGROUND OF THE INVENTION

1. Field of the Invention

The present disclosure relates to a clock circuit, especially to an operating clock generator and a reference clock gating circuit.

2. Description of Related Art

FIG. 1 shows a phase-locked loop of a system on a chip (SoC) for generating a frequency-multiplication clock according to an external reference clock. The SoC operates based on a Peripheral Component Interconnect express (PCIe) standard; the phase-locked loop 110 of a PCIe physical layer circuit in the SoC relies on a reference clock (REFCLK) from an external device 120 (e.g., a mainboard of a general personal computer) to generate the high-speed and stable frequency-multiplication clock (pclk) as an operating clock. However, in some circumstance (e.g., an early power-on stage of the SoC, or a circumstance that the SoC just returns to a normal mode from a low-power mode) the reference clock from the external device 120 is not stable, and it takes a period of time to become stable. In light of the above, if the SoC refers to the above-mentioned unstable reference clock to generate the frequency-multiplication clock as the operating clock, this operating clock is likely to cause the SoC to operate abnormally and likely to cause damage to the SoC.

An SoC based on other kinds of standards (e.g., Serial Advanced Technology Attachment (SATA)) will encounter a similar problem.

SUMMARY OF THE INVENTION

An object of the present disclosure is to provide an operating clock generator and a reference clock gating circuit for ensuring a reference clock reliable.

An embodiment of the operating clock generator of the present disclosure includes a reference clock gating circuit and an operating clock generating circuit. The reference clock gating circuit is configured to perform a detection operation and thereby output a reference clock according to an external clock, wherein the external clock is originated from an external clock source, and the operating clock generator and the external clock source are separate and not included in the same integrated circuit. The reference clock gating circuit includes a detection circuit and a gating component. The detection circuit includes: a first counter configured to count according to triggers of the external clock and thereby generate a first clock number; a second counter configured to count according to triggers of a slow clock and thereby generate a second clock number, wherein a frequency of the slow clock is lower than a frequency of the external clock and the slow clock is originated from a crystal oscillator; and a decision circuit configured to determine whether a ratio of the first clock number to the second clock number satisfies a predetermined condition after the second clock number reaches K times a predetermined number, and accordingly generate a gating signal, wherein the K is a positive integer. The gating component is configured to receive the external clock and output it as the reference clock in a circumstance that the detection operation is performed and the gating signal indicates that the ratio satisfies the predetermined condition; and the gating component is configured to reject the external clock in a circumstance that the detection operation is performed and the gating signal indicates that the ratio does not satisfy the predetermined condition. The operating clock generating circuit is coupled to the gating component and configured to generate an operating clock according to the reference clock.

An embodiment of the reference clock gating circuit is for performing a detection operation and accordingly outputting a reference clock according to an external clock, wherein the external clock is originated from an external clock source, the reference clock gating circuit and the external clock source are separate and not included in the same integrated circuit. The reference clock gating circuit includes a detection circuit and a gating component. The detection circuit includes: a first counter configured to count according to triggers of the external clock and thereby generate a first clock number; a second counter configured to count according to triggers of a slow clock and thereby generate a second clock number, wherein a frequency of the slow clock is lower than a frequency of the external clock and the slow clock is originated from a crystal oscillator; and a decision circuit configured to determine whether a ratio of the first clock number to the second clock number satisfies a predetermined condition after the second clock number reaches K times a predetermined number, and accordingly generate a gating signal, wherein the K is a positive integer. The gating component is configured to receive the external clock and output it as the reference clock in a circumstance that the detection operation is performed and the gating signal indicates that the ratio satisfies the predetermined condition; and the gating component is configured to reject the external clock in a circumstance that the detection operation is performed and the gating signal indicates that the ratio does not satisfy the predetermined condition.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses an operating clock generator and a reference clock gating circuit capable of verifying whether an external clock is reliable and outputting the external clock as a reference clock when the external clock is reliable.

Figure 1:
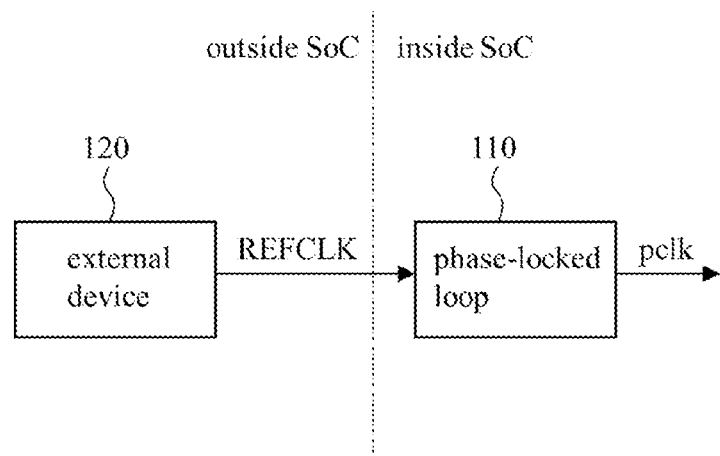
FIG. 1 shows a phase-locked loop of a system on a chip (SoC) for generating a frequency-multiplication clock according to an external reference clock.
Figure 2:
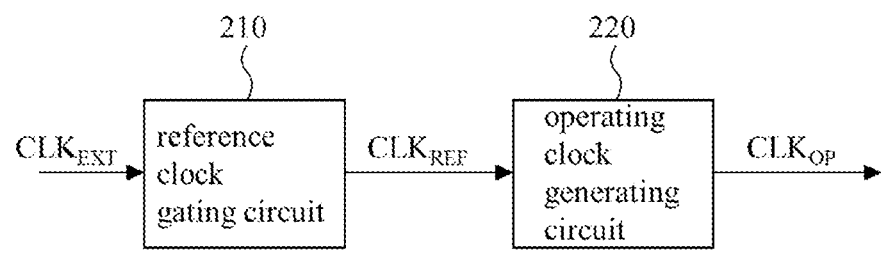
FIG. 2 shows an embodiment of the operating clock generator of the present disclosure.

FIG. 2 shows an embodiment of the operating clock generator of the present disclosure. The operating clock generator 200 of FIG. 2 includes a reference clock gating circuit 210 and an operating clock generating circuit 220. The reference clock gating circuit 210 is configured to perform a detection operation to find out whether an external clock ($CLK_{EXT}$) is reliable, and configured to output the external clock as a reference clock ($CLK_{REF}$) when the result of the detection operation indicates that the external clock is reliable. The external clock is originated from an external clock source, and the operating clock generator 200 and the external clock source are separate and not included in the same integrated circuit (e.g., a system on a chip (SoC)). The operating clock generating circuit 220 (e.g., a known/self-developed phase-locked loop) is coupled to the reference clock gating circuit 210, and configured to receive the reference clock and accordingly generate an operating clock ($CLK_{OP}$).

Figure 3:
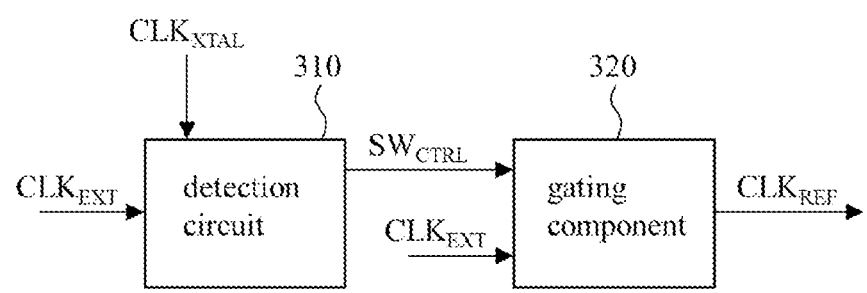
FIG. 3 shows an embodiment of the reference clock gating circuit of FIG. 2.

FIG. 3 shows an embodiment of the reference clock gating circuit 210 of FIG. 2. As shown in FIG. 3, the reference clock gating circuit 210 includes a detection circuit 310 and a gating component 320. The detection circuit 310 is configured to perform the aforementioned detection operation according to the external clock ($CLK_{EXT}$) and a slow clock ($CLK_{XTAL}$), and thereby generate a gating signal ($SW_{CTRL}$) to indicate whether the external clock is reliable. When the detection operation is performed, the gating component 320 (e.g., a switch) is configured to receive the external clock and output it as the reference clock in a circumstance that the gating signal indicates that the external clock is reliable (e.g., a circumstance that the gating signal is at a high level), and configured to reject the external clock in a circumstance that the gating signal indicates that the external clock is not reliable (e.g., a circumstance that the gating signal is at a low level). In brief, when the detection operation is performed, the gating component 320 does not output the external clock as the reference clock if the external clock is found unreliable. After the external clock is stable and reliable, the detection operation can optionally be stopped; when the detection operation is not performed, the gating component 320 is configured to receive the external clock and output it as the reference clock while the gating signal remains at a level (e.g., a high level) to permit the gating component 320 outputting the external clock.

Figure 4:
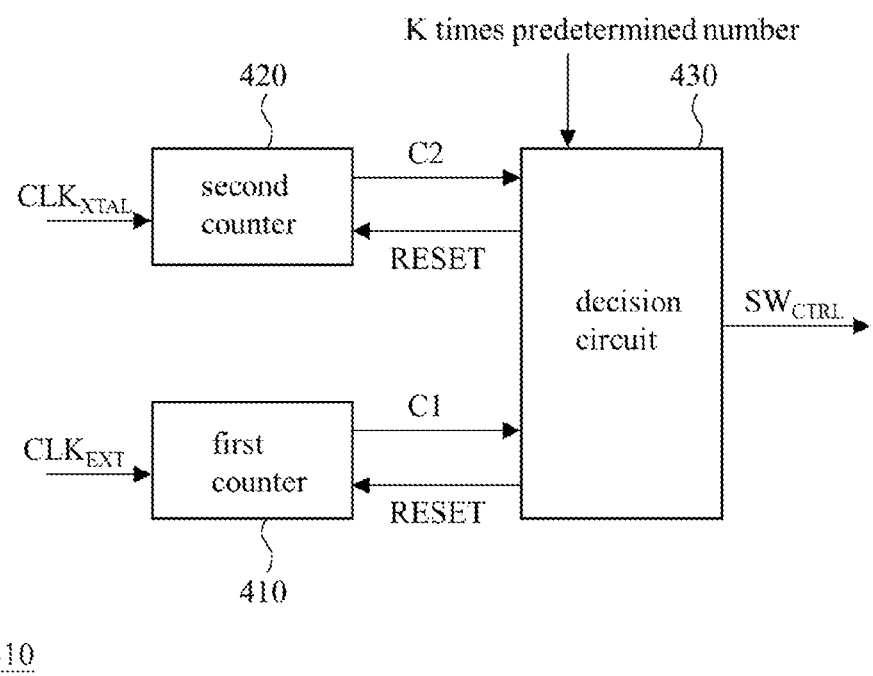
FIG. 4 shows an embodiment of the detection circuit of FIG. 3.

FIG. 4 shows an embodiment of the detection circuit 310 of FIG. 3. As shown in FIG. 4, the detection circuit 310 includes a first counter 410, a second counter 420, and a decision circuit 430. The first counter is a known or self-developed counter, and configured to count according to triggers of the external clock and thereby generate a first clock number (C1). The second counter is a known or self-developed counter, and configured to count according to triggers of the slow clock and thereby generate a second clock number (C2). The frequency (e.g., 25 MHz) of the slow clock is lower than the frequency of the external clock (e.g., 100 MHz), and the slow clock is originated from a crystal oscillator (e.g., a known/self-developed crystal oscillator such as a quartz oscillator) (not shown) and quite accurate. The crystal oscillator can be included in the reference clock gating circuit 210, or be outside the reference clock gating circuit 210. It should be noted that since the slow clock is reliable, the second clock number can be treated as a reference basis for the decision circuit 430 making its decision.

Please refer to FIG. 4. After the second clock number reaches K (e.g., a positive integer) times a predetermined number, the decision circuit 430 is configured to determine whether a ratio of the first clock number to the second clock number $$\left(\frac{C1}{C2}\right) \quad (C1C2)$$

satisfies a predetermined condition $$\left(\text{e.g., } \frac{C1}{C2} = \frac{\text{frequency of external clock (e.g., 100 MHz)}}{\text{frequency of slow clock (e.g., 25 MHz)}},\right.$$
$$\left. \text{or } \left|C2 \times \frac{\text{frequency of external clock (e.g., 100 MHz)}}{\text{frequency of slow clock (e.g., 25 MHz)}} - C1\right| \leq \right.$$
$$\left. \text{predetermined threshold}\right),$$

and accordingly generate the gating signal. In a circumstance that the gating signal indicates that the ratio satisfies the predetermined condition, the gating component 320 receives the external clock and output it as the reference clock; and in a circumstance that the gating signal indicates that the ratio does not satisfy the predetermined condition, the gating component 320 does not output the external clock.

Figure 5:
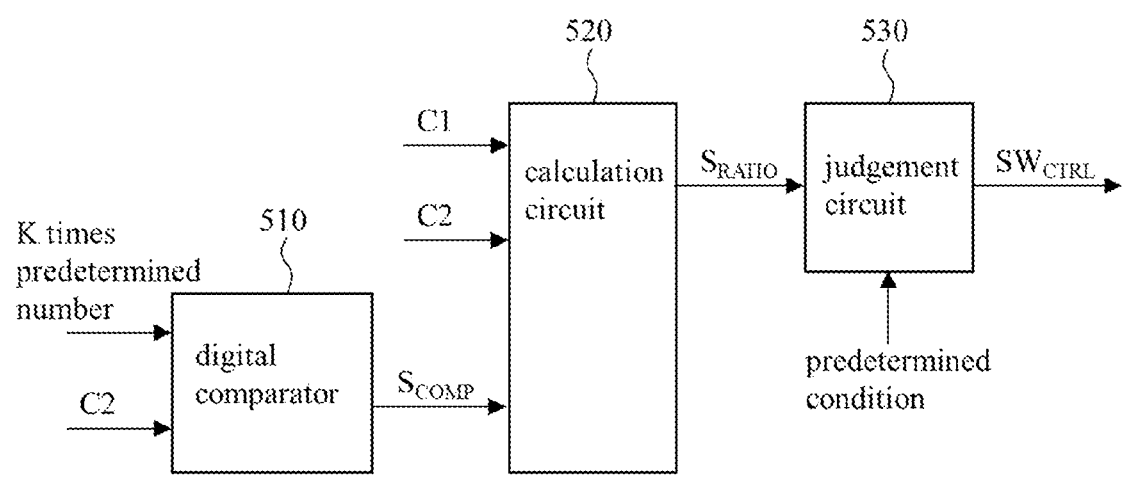
FIG. 5 shows an embodiment of the decision circuit of FIG. 4.

FIG. 5 shows an embodiment of the decision circuit 430 of FIG. 4. As shown in FIG. 5, the decision circuit 430 includes a digital comparator 510, a calculation circuit 520, and a judgement circuit 530. The digital comparator 510 is configured to compare the second clock number with the number of K times the predetermined number (hereafter referred to as "K×P") and thereby generate a comparison result ($S_{COMP}$) indicating whether the second clock number reaches K×P, wherein the K is a positive integer as mentioned in the preceding paragraph and P denotes the predetermined number. If the second clock number reaches K×P at a time point (hereafter referred to as "target time point"), the calculation circuit 520 is configured to calculate "the ratio ($S_{RATIO}$) of the first clock number to the second clock number at the target time point" after the comparison result indicates that the second clock number reaches K×P. The judgement circuit 530 is configured to determine whether the ratio satisfies the predetermined condition; if so, the external clock is reliable. In an exemplary implementation, providing the predetermined condition is a predetermined value $$\left(\text{e.g., } \frac{\text{frequency of external clock (e.g., 100 MHz)}}{\text{frequency of slow clock (e.g., 25 MHz)}}\right),$$

the judgement circuit 530 includes a comparator (not shown) for comparing the ratio with the predetermined value and then generating a comparison result (i.e., the gating signal $SW_{CTRL}$) indicating whether the ratio is equal to the predetermined value. In another exemplary implementation, providing the predetermined condition is a predetermined range (e.g., a range between a low threshold and a high threshold), the judgement circuit 530 includes at least one comparator (not shown) for comparing the ratio with at least one of the low and high thresholds of the predetermined range and then generating at least one comparison result indicating whether the ratio falls within the predetermined range.

Figure 6:
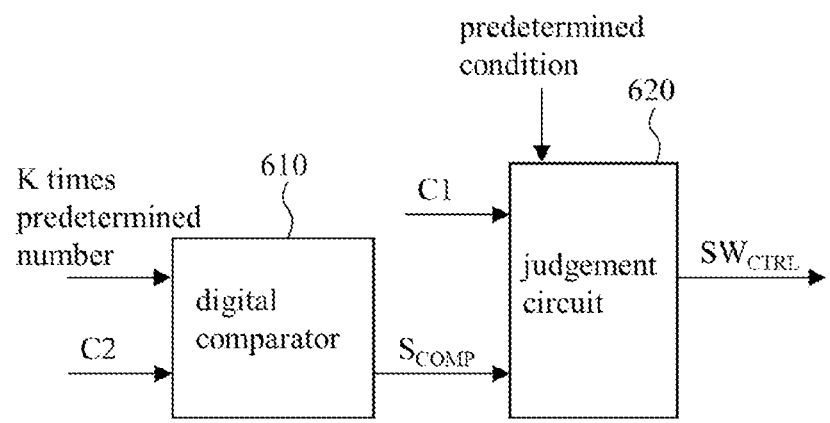
FIG. 6 shows another embodiment of the decision circuit of FIG. 4.

FIG. 6 shows another embodiment of the decision circuit 430 of FIG. 4. As shown in FIG. 6, the decision circuit 430 includes a digital comparator 610 and a judgement circuit 620. The digital comparator 610 is configured to compare the second clock number with K times the predetermined number (hereafter referred to as "K×P") and thereby generate a comparison result indicating whether the second clock number reaches K×P. If the second clock number reaches K×P at a time point (hereafter referred to as "target time point"), the judgement circuit 620 determines whether the first clock number satisfies the predetermined condition at the target time point; if so, the external clock is reliable. Since the second clock number is equal to K×P at the target time point, the determination made by the judgement circuit 620 is equivalent to a determination of whether the ratio of the first clock number to the second clock number satisfies the predetermined condition. In an exemplary implementation, providing an ideal ratio of the external clock to the slow clock is 4

$$\left(\text{i.e., } \frac{\text{frequency of external clock (e.g., 100 MHz)}}{\text{frequency of slow clock (e.g., 25 MHz)}} = 4\right),$$

the predetermined number is 100, and the predetermined condition is a predetermined range between a low threshold "395" and a high threshold "405", when the second clock number reaches the predetermined number "100" at the target time point, an ideal first clock number should be the ideal ratio times the second clock number (i.e., 4×100=400) at the target time point. In the above-mentioned exemplary implementation, the judgement circuit 520 includes at least one comparator (not shown) for comparing the actual first clock number (e.g., 397) with at least one of the low and high thresholds and thereby generating at least one comparison result (e.g., low threshold "395"<first clock number "397"<high threshold "405") indicating whether the first clock number falls within the predetermined range.

Please refer to FIGS. 2-4. In an exemplary implementation, on condition that the ratio of the first clock number to the second clock number does not satisfy the predetermined condition, the decision circuit 430 generates a control signal (RESET) to make the reference clock gating circuit 210 perform the detection operation again. For example, when the ratio of the first clock number to the second clock number does not satisfy the predetermined condition, the decision circuit 430 generates the control signal (e.g., a reset signal at a high level) to reset the first counter 410 and the second counter 420 and thereby makes the reference clock gating circuit 210 perform the detection operation again. In another exemplary implementation, on condition that the ratio of the first clock number to the second clock number does not satisfy the predetermined condition, the decision circuit 430 generates a control signal (e.g., a reset signal at a low level) to allow the reference clock gating circuit 210 to continue performing the detection operation. For example, when the ratio of the first clock number to the second clock number does not satisfy the predetermined condition, the decision circuit 430 generates the control signal to make the first counter 410 and the second counter 420 continue counting and thereby makes the reference clock gating circuit 210 continue performing the detection operation. Theoretically, since the external clock will gradually become stable, the ratio of the first clock number to the second clock number will gradually approach the predetermined condition and finally satisfy the predetermined condition.

Please refer to FIGS. 2-6. In an exemplary implementation, both the aforementioned external clock source and the operating clock generator 200 are set on the same circuit board (e.g., a mainboard of a general personal computer). In an exemplary implementation, the frequency (e.g., 100 MHz) of the external clock is higher than two times the frequency (e.g., 25 MHz) of the slow clock, but lower than the frequency (e.g., 2.5 GHz) of the operating clock; however, the present invention is not limited to the above features, and only requires that the slow clock is more accurate than the external clock. In an exemplary implementation, the reference clock gating circuit 210 performs the detection operation according to at least one of the following: a signal indicative of an early power-on stage of the operating clock generator 200; a fixed detection period; and a predetermined trigger event. Examples of the predetermined trigger event are as follows: the external clock source of a system or the operating clock generator 200 being reset; the variation of a supply voltage of the system or the operating clock generator 200 reaching a predetermined degree of variation; and an integrated circuit including the operating clock generator 200 returning to a normal mode from a low power mode. In an exemplary implementation, if the result of the detection operation indicates that the external clock changes from a reliable clock to an unreliable clock, the reference clock gating circuit 210 uses a signal (e.g., the gating signal) to disable/reset the operating clock generating circuit 220; and if the result of the detection operation indicates that the external clock changes from an unreliable clock to a reliable clock, the reference clock gating circuit 210 uses a signal (e.g., the gating signal) to enable the operating clock generating circuit 220.

It should be noted that the reference clock gating circuit 210 can be implemented independently for outputting a reliable reference clock, and the reference clock gating circuit 210 can cooperate with other known/self-developed operating clock generators to generate an operating clock. It should also be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the present invention can verify whether an external clock is reliable and thereby output the external clock as a reference clock after the external clock is reliable.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:
1. An operating clock generator, comprising:
a reference clock gating circuit configured to perform a detection operation and thereby output a reference clock according to an external clock, wherein the external clock is originated from an external clock source, the operating clock generator and the external clock source are separate and not included in one integrated circuit, and the reference clock gating circuit includes:

a detection circuit including:
  a first counter configured to count according to triggers of the external clock and thereby generate a first clock number;
  a second counter configured to count according to triggers of a slow clock and thereby generate a second clock number, wherein a frequency of the slow clock is lower than a frequency of the external clock and the slow clock is originated from a crystal oscillator; and
  a decision circuit configured to determine whether a ratio of the first clock number to the second clock number satisfies a predetermined condition after the second clock number reaches K times a predetermined number, and accordingly generate a gating signal, wherein the K is a positive integer; and
  a gating component configured to receive the external clock and output the external clock as the reference clock in a circumstance that the detection operation is performed and the gating signal indicates that the ratio satisfies the predetermined condition, and the gating component configured to reject the external clock in a circumstance that the detection operation is performed and the gating signal indicates that the ratio does not satisfy the predetermined condition; and
an operating clock generating circuit coupled to the gating component and configured to generate an operating clock according to the reference clock.

2. The operating clock generator of claim 1, wherein the frequency of the external clock is higher than the frequency of the slow clock but lower than a frequency of the operating clock.

3. The operating clock generator of claim 1, wherein the reference clock gating circuit includes the crystal oscillator.

4. The operating clock generator of claim 1, wherein the predetermined condition includes at least one of following: the ratio is equal to a predetermined value; the ratio falls within a first predetermined range; and the first clock number falls within a second predetermined range that is determined according to an ideal ratio of the external clock to the slow clock.

5. The operating clock generator of claim 1, wherein the reference clock gating circuit performs the detection operation according to at least one of following: a signal indicative of an early power-on stage of the operating clock generator, a fixed detection period; and a predetermined trigger event.

6. The operating clock generator of claim 1, wherein in a circumstance that the detection operation is not performed, the gating component receives the external clock and outputs the external clock as the reference clock.

7. The operating clock generator of claim 1, wherein on condition that the ratio of the first clock number to the second clock number does not satisfy the predetermined condition, the decision circuit generates a control signal to make the reference clock gating circuit perform the detection operation again.

8. The operating clock generator of claim 7, wherein when the ratio of the first clock number to the second clock number does not satisfy the predetermined condition, the decision circuit generates the control signal to reset the first counter and the second counter and thereby makes the reference clock gating circuit perform the detection operation again.

9. The operating clock generator of claim 1, wherein on condition that the ratio of the first clock number to the second clock number does not satisfy the predetermined condition, the decision circuit generates a control signal to make the reference clock gating circuit continue performing the detection operation.

10. The operating clock generator of claim 9, wherein when the ratio of the first clock number to the second clock number does not satisfy the predetermined condition, the decision circuit generates the control signal to make the first counter and the second counter continue counting and thereby makes the reference clock gating circuit continue performing the detection operation.

11. A reference clock gating circuit for performing a detection operation and thereby outputting a reference clock according to an external clock, wherein the external clock is originated from an external clock source, the reference clock gating circuit and the external clock source are separate and not included in one integrated circuit, and the reference clock gating circuit comprises:
  a detection circuit including:
    a first counter configured to count according to triggers of the external clock and thereby generate a first clock number;
    a second counter configured to count according to triggers of a slow clock and thereby generate a second clock number, wherein a frequency of the slow clock is lower than a frequency of the external clock and the slow clock is originated from a crystal oscillator; and
    a decision circuit configured to determine whether a ratio of the first clock number to the second clock number satisfies a predetermined condition after the second clock number reaches K times a predetermined number, and accordingly generate a gating signal, wherein the K is a positive integer; and
  a gating component configured to receive the external clock and output the external clock as the reference clock in a circumstance that the detection operation is performed and the gating signal indicates that the ratio satisfies the predetermined condition, and the gating component configured to reject the external clock in a circumstance that the detection operation is performed and the gating signal indicates that the ratio does not satisfy the predetermined condition.

12. The reference clock gating circuit of claim 11, wherein the frequency of the external clock is higher than the frequency of the slow clock but lower than a frequency of the operating clock.

13. The reference clock gating circuit of claim 11, wherein the crystal oscillator is included in the reference clock gating circuit.

14. The reference clock gating circuit of claim 11, wherein the predetermined condition includes at least one of following: the ratio is equal to a predetermined value; the ratio falls within a first predetermined range; and the first clock number falls within a second predetermined range that is determined according to an ideal ratio of the external clock to the slow clock.

15. The reference clock gating circuit of claim 11, wherein the reference clock gating circuit performs the detection operation according to at least one of following: a signal indicative of an early power-on stage of the operating clock generator; a fixed detection period; and a predetermined trigger event.

16. The reference clock gating circuit of claim 11, wherein in a circumstance that the detection operation is not performed, the gating component receives the external clock and outputs the external clock as the reference clock.

17. The reference clock gating circuit of claim 11, wherein on condition that the ratio of the first clock number to the second clock number does not satisfy the predetermined condition, the decision circuit generates a control signal to make the reference clock gating circuit perform the detection operation again.

18. The reference clock gating circuit of claim 17, wherein when the ratio of the first clock number to the second clock number does not satisfy the predetermined condition, the decision circuit generates the control signal to reset the first counter and the second counter and thereby makes the reference clock gating circuit perform the detection operation again.

19. The reference clock gating circuit of claim 11, wherein on condition that the ratio of the first clock number to the second clock number does not satisfy the predetermined condition, the decision circuit generates a control signal to make the reference clock gating circuit continue performing the detection operation.

20. The reference clock gating circuit of claim 19, wherein on condition that the ratio of the first clock number to the second clock number does not satisfy the predetermined condition, the decision circuit generates the control signal to make the first counter and the second counter continue counting and thereby makes the reference clock gating circuit continue performing the detection operation.

* * * * *